United States Patent
Shvarts et al.

(10) Patent No.: US 6,788,151 B2
(45) Date of Patent: Sep. 7, 2004

(54) VARIABLE OUTPUT POWER SUPPLY

(75) Inventors: Emanuil Y. Shvarts, Hillsborough, NJ (US); Anthony A. Triolo, Succasunna, NJ (US); Norman Gerard Ziesse, Chester, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 71 days.

(21) Appl. No.: 10/072,518

(22) Filed: Feb. 6, 2002

(65) Prior Publication Data

US 2003/0146791 A1 Aug. 7, 2003

(51) Int. Cl.[7] .................................................. H03F 3/04
(52) U.S. Cl. ...................................... 330/297; 330/127
(58) Field of Search .......................... 330/10, 136, 297, 330/127, 199

(56) References Cited

U.S. PATENT DOCUMENTS

| | | | |
|---|---|---|---|
| 4,028,633 A | 6/1977 | Rogers et al. | 330/118 |
| 4,573,018 A | 2/1986 | Mirow | 330/10 |
| 4,975,819 A | 12/1990 | Lannuzel | 363/16 |
| 5,142,240 A * | 8/1992 | Isota et al. | 330/136 |
| 5,291,382 A | 3/1994 | Cohen | 363/16 |
| 5,568,094 A | 10/1996 | Bowen et al. | 330/279 |
| 5,675,288 A | 10/1997 | Peyrotte et al. | 330/149 |
| 5,754,413 A | 5/1998 | Fraidlin et al. | 363/16 |
| 5,758,269 A | 5/1998 | Wu | 455/127 |
| 5,787,336 A * | 7/1998 | Hirschfield et al. | 455/13.4 |
| 5,831,475 A | 11/1998 | Myers et al. | 330/10 |
| 5,861,777 A | 1/1999 | Sigmon et al. | 330/136 |
| 6,037,755 A | 3/2000 | Mao et al. | 323/222 |
| 6,064,266 A | 5/2000 | Anderson et al. | 330/284 |
| 6,069,807 A | 5/2000 | Boylan et al. | 363/97 |
| 6,084,468 A | 7/2000 | Sigmon et al. | 330/136 |
| 6,091,934 A * | 7/2000 | Berman et al. | 455/13.4 |
| 6,097,252 A | 8/2000 | Sigmon et al. | 330/136 |
| 6,107,880 A * | 8/2000 | Shaw | 330/136 |
| 6,122,491 A | 9/2000 | Francisco | 455/127 |
| 6,157,253 A * | 12/2000 | Sigmon et al. | 330/10 |

OTHER PUBLICATIONS

K. Yang et al., "High–Efficiency Class–A Power Amplifiers With a Dual–Bias–Control Scheme," IEEE Transactions on Microwave Theory and Techniques, vol. 47, No. 8, pp. 1426–1432, Aug. 1999.

Gary Hanington et al., "Microwave Power Amplifier Efficiency Improvement With a 10 MHz HBT DC–DC Converter," IEEE MTT–S Digest, pp. 589–592, 1998.

* cited by examiner

Primary Examiner—Khanh Van Nguyen

(57) ABSTRACT

A variable output power supply for use in a highly efficient linear amplification system includes an envelope detector having at least one input for receiving an input signal to be amplified. The envelope detector generates, as an output, a control signal that is representative of an envelope of the input signal. The variable output power supply further includes a controllable source that is coupled to the envelope detector. The controllable source generates an output voltage and/or current that is responsive to the control signal, such that the output of the variable output power supply dynamically changes as a function of the envelope of the input signal. When employed in a linear amplification system, the variable output power supply provides a supply voltage to a linear amplifier which can be dynamically varied in response to the envelope of the input signal so as to provide a substantially constant voltage supply headroom for the amplifier. In this manner, an efficiency and frequency response of the amplification system is improved, and a reduction in overall power dissipation of the amplification system can be achieved.

16 Claims, 6 Drawing Sheets

VARIABLE OUTPUT POWER SUPPLY

FIELD OF THE INVENTION

The present invention relates generally to power amplification, and more particularly relates to a variable output power supply for use, for example, in a highly efficient linear amplification system.

BACKGROUND OF THE INVENTION

It is well-established that the linear amplification of signals having an amplitude-varying envelope is a notoriously inefficient process. This inefficiency arises, at least in part, from the fact that an amplifier employed for the amplification of an amplitude-varying signal must possess enough voltage headroom between positive and negative voltage supply rails of the amplifier to allow amplification of the peaks of the signal without clipping, which can result in distortion of the output signal of the amplifier.

In addition to distortion resulting from attempting to amplify a signal beyond the voltage supply rails of the amplifier, another known disadvantage of conventional power amplifiers is that when the amplified signal is at or near one or both voltage supply rails of the amplifier, the amplifier can become saturated and generally exhibit nonlinear operation. The nonlinear operation of a saturated amplifier causes an increase in intermodulation products, resulting in undesirable amounts of energy in frequency bands other than a frequency band intended for use. This undesirable energy is often referred to as Adjacent Channel Power (ACP). Since efficiency has traditionally been improved by driving an amplifier into saturation, it is evident that there exists a tradeoff between increasing amplifier efficiency and decreasing intermodulation products.

Typically, in order to amplify large amplitude signals, the positive and negative voltage supply rails of the amplifier are set to a predetermined level so as to provide sufficient headroom, such that an amplified output signal of the amplifier exhibits essentially no clipping and substantially no distortion. When the same amplifier is used to amplify small amplitude signals, however, the additional voltage headroom provided by the fixed voltage supply results in unnecessary power dissipation and inefficiency in the amplifier.

Accordingly, there exists a need for a linear power amplifier having improved efficiency, particularly in applications involving the amplification of signals having amplitude-varying envelopes. Furthermore, it would be desirable to achieve such efficiency while reducing intermodulation products, distortion and amplifier power dissipation.

SUMMARY OF THE INVENTION

The present invention provides techniques for increasing an efficiency of a linear power amplifier by dynamically varying an output voltage of a variable output power supply coupled to the power amplifier such that the variable output power supply maintains a minimum voltage headroom in the amplifier regardless of the amplitude of an input signal presented to the amplifier. In this manner, an efficiency and frequency response of the amplifier is advantageously improved and a power dissipation of the amplifier is significantly reduced.

In accordance with one aspect of the invention, a variable output power supply for use in a highly efficient linear amplification system includes an envelope detector having at least one input for receiving an input signal to be amplified. The envelope detector includes an output for generating a control signal that is representative of an envelope of the input signal. The variable output power supply further includes a controllable voltage source that is coupled to the envelope detector. The controllable voltage source generates an output voltage that is responsive to the control signal, such that the output voltage dynamically changes as a function of the envelope of the input signal. When employed in a linear amplification system, the variable output power supply provides a supply voltage to a linear amplifier which is dynamically adjusted in response to the envelope of the input signal so as to provide a substantially constant voltage headroom for the amplifier.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative linear power amplification system. It should be appreciated, however, that the present invention is not limited to this or any particular power amplification system. Rather, the invention is more generally applicable to providing a programmable voltage source which is configured to dynamically varying an output voltage generated by the programmable voltage source in response to an amplitude of an input signal presented to the programmable voltage source. It is to be appreciated that the term "programmable" as used herein refers to the controllability and/or variability of the power supply output, either manually (e.g., by a user) or automatically, such as, for example, in response to a control signal or alternative control means.

Figure 1A:
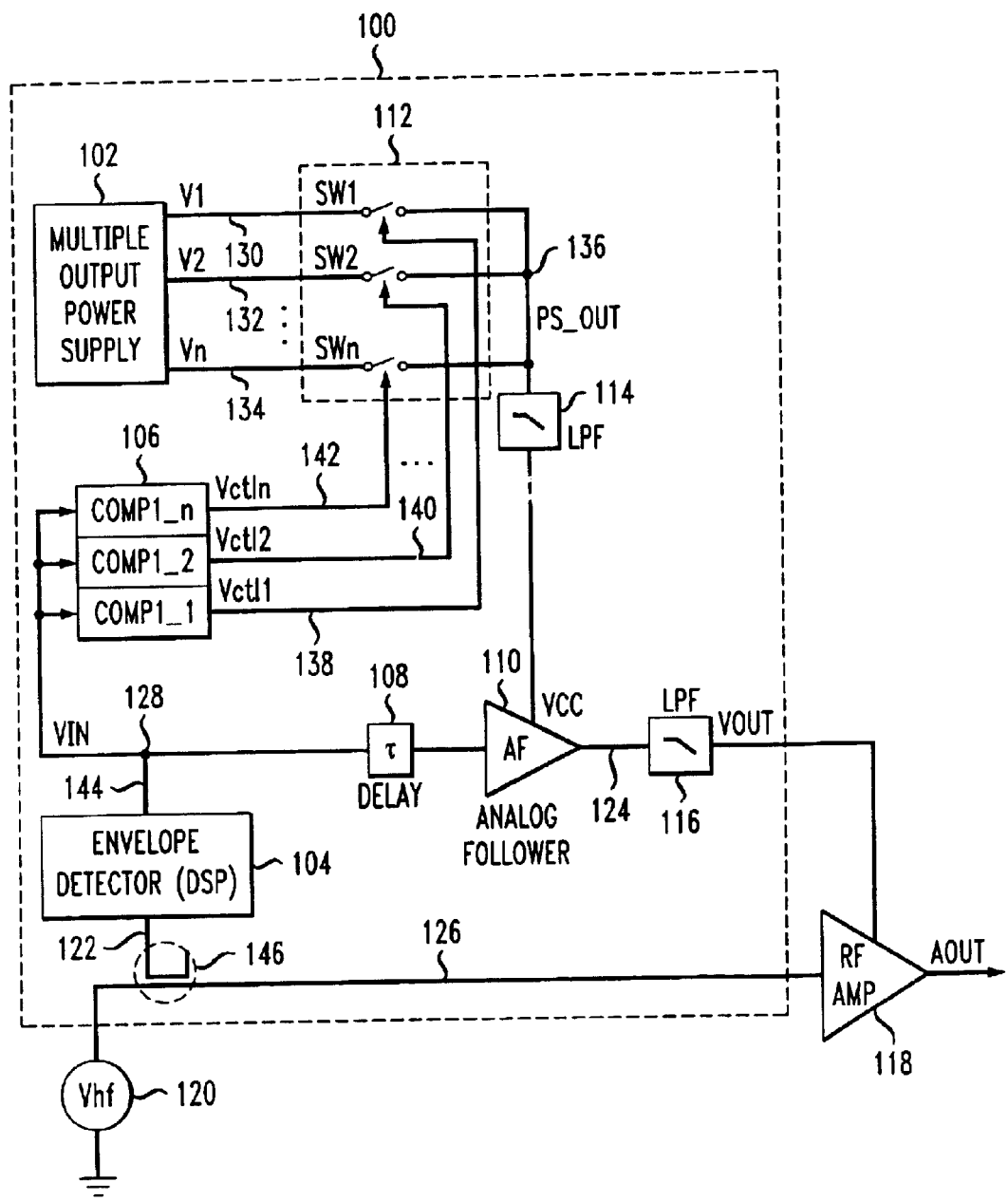
FIG. 1A is a block diagram depicting an exemplary variable output power supply used in an efficient linear power amplification system, in accordance with one aspect of the present invention.

FIG. 1A depicts a schematic diagram of an illustrative variable output power supply 100 operatively coupled to a radio frequency (RF) amplifier 118 to form a highly efficient linear amplification system, in accordance with one aspect of the present invention. For ease of explanation, the illustrative variable output power supply 100 may be grouped according to functional sub-circuits, including a multiple output power supply 102 operatively coupled to a multiplexing circuit 112, an envelope detector 104, control circuitry 106, and an analog follower (AF) 110. Each of these sub-circuits is described in further detail below. It is to be appreciated that certain of these functional sub-circuits maybe combined with or incorporated into one or more other circuits, as will be understood by those skilled in the art. For example, the multiple output power supply 102, the multiplexing circuit 112, and the control circuitry 106 may be operatively incorporated into a single controllable voltage or current source (not shown).

The multiple output power supply 102 preferably generates a plurality of substantially fixed output voltages V1, V2, . . . , Vn on corresponding outputs 130, 132, 134, respectively, associated with the multiple output power supply. It is to be appreciated that the multiple output power supply 102 may also (or instead) generate a plurality of output currents. Each of these outputs 130, 132, 134 can be selectively connected to a common output voltage node 136 via the multiplexing circuit 112 to provide a desired output voltage PS_OUT. The multiplexing circuit 112 may be illustrated as n selectable single-pole, single-throw (SPST) switches SW1, SW2, . . . , SWn coupled at one terminal to the multiple output power supply, where n can be any integer greater than one and corresponds to the number of outputs associated with the multiple output power supply 102. The switches are preferably coupled together at another terminal to form the common output voltage node 136. Each switch SW1, SW2, . . . , SWn associated with the multiplexing circuit 112 maybe implemented by a single transistor, such as, for example, a bipolar junction transistor (BJT), field effect transistor (FET), etc., or by alternative switching circuitry. It is to be appreciated that the multiplexing circuit 112 may similarly include a multiplexor, or alternative circuitry for selecting a desired power supply output voltage.

Each of the switches SW1, SW2, . . . , SWn preferably includes a control input and is selectively enabled by a control signal Vctl1, Vctl2, . . . , Vctln, respectively, presented to a corresponding control input. When enabled, the two terminals of a selected switch are electrically connected together. The voltage PS_OUT provided at node 136 will be dependent upon which of the switches SW1, SW2, . . . , SWn are enabled. For example, if switch SW1 is enabled, output 130 of the multiple output power supply 102 will be electrically connected to node 136, and thus the voltage PS_OUT at node 136 will be V1. Preferably, the voltage appearing at node 136 will be one of the plurality of voltages V1, V2, . . . , Vn supplied by the multiple output power supply 102. It is assumed that the multiple output power supply 102 is configured such that more than one output may be active simultaneously. Therefore, the present invention further contemplates that node 136 may be used as a summing junction, whereby the voltage PS_OUT provided at node 136 will be determined by the respective contributions of one or more selected outputs of the multiple output power supply 102.

The control circuitry 106 included in the illustrative variable output power supply 100 is preferably operatively coupled to the multiplexing circuit 112 and generates the plurality of control signals Vctl1, Vctl2, . . . , Vctln for controlling the corresponding switches associated with the multiplexing circuit 112. The control circuitry 106 may include n comparators COMP1_1, COMP1_2, . . . , COMP1_n, where n is an integer greater than one and corresponds to the number of discrete voltage outputs associated with the multiple output power supply 102. An output 138, 140, 142 associated with each of the comparators COMP1_1, COMP1_2, . . . , COMP1_n, respectively, is preferably coupled to the control input of a corresponding switch SW1, SW2, . . . , SWn, respectively, for controlling which of the voltage outputs of the multiple output power supply 102 will appear at node 136. The output of each comparator may be a digital signal, such that when a given comparator output is a low level (e.g., zero volts), a corresponding switch is disabled (i.e., off), and when the comparator output is a high level (e.g., 5 volts), the corresponding switch is enabled (i.e., on).

Each of the comparators COMP1_1, COMP1_2, . . . , COMP1_n associated with the control circuitry 106 preferably includes at least two inputs, only one of which is shown in the figure. One input of each of the comparators is preferably coupled together to form a common input at node 128 for receiving a voltage control signal VIN presented to the control circuitry 106. Another input of each comparator may be connected to a substantially constant voltage reference source (not shown), such that each of the comparators has a different voltage threshold associated therewith. The voltage reference source used to set the thresholds of the comparators may be included in the control circuitry 106. Alternatively, a reference voltage or current may be supplied by an external reference source (not shown). Preferably, a single reference source may be employed in conjunction with circuitry (e.g., a voltage divider, voltage level shifter, etc.) for generating all the reference voltages required for the plurality of comparators associated with the control circuitry 106.

Figure 1B:
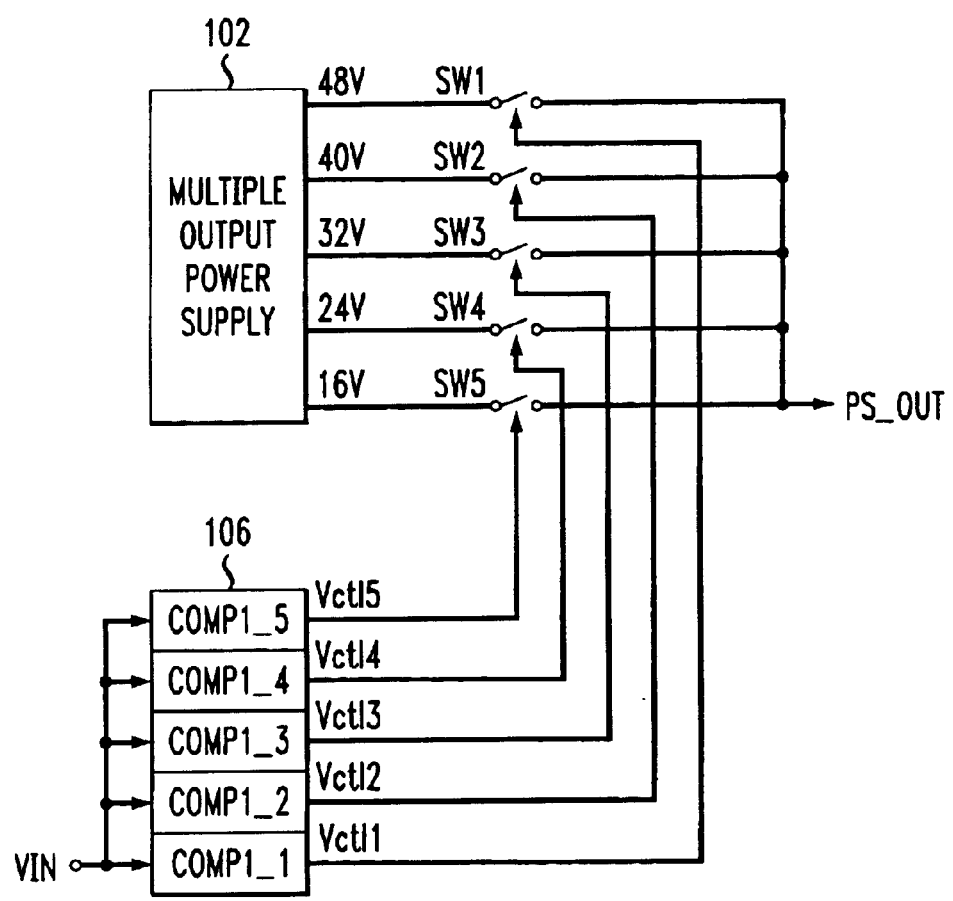
FIG. 1B is a block diagram illustrating a portion of the variable output power supply of FIG. 1A for an exemplary case n=5, in accordance with the present invention.

By way of example only, consider a case in which the multiple output power supply 102 generates five output voltage levels (i.e., n=5), namely, V1=48 volts (V), V2=40 volts, V3=32 volts, V4=24 volts, and V5=16 volts, as shown in FIG. 1B. Since n=5 for this example, there will be five switches SW1, SW2, . . . , SW5, each switch being coupled to a corresponding output V1, V2, . . . , V5, respectively, of the multiple output power supply 102. Additionally the control circuitry 106 will include five comparators COMP1_1, COMP1_2, . . . , COMP1_5 for generating the five control signals Vctl1, Vctl2, . . . , Vctl5, for selectively controlling the switches. Each of the comparators is preferably set to a predetermined threshold voltage, as previously explained.

The threshold voltage of a given comparator relating to one of the outputs from the multiple output power supply 102 may be set to a value which is approximately equal to the voltage corresponding to a next lowest output of the multiple output power supply with respect to the corresponding output. For example, the threshold of COMP1_1, which is used to control switch SW1 associated with the 48 volt output, may be set to have a threshold of 40 volts, the next lowest output generated by the multiple output power supply. Likewise, the threshold of COMP1_2 may be set to 32 volts, the threshold of COMP1_3 maybe set to 24 volts, the threshold of COMP1_4 may be set to 16 volts, and the threshold of COMP1_5 maybe set to zero volts. In a practical sense, the lowest threshold comparator, COMP1_5, may be eliminated. It is to be appreciated that the threshold voltage of any given comparator maybe set to any value within a range that is between the corresponding output voltage and the next lowest output voltage of the multiple output power supply. Therefore, the threshold of comparator COMP1_1 may be set to have a threshold in a range between about 40 volts and 48 volts, the threshold of comparator COMP1_2 may be set to a value between about 32 volts and 40 volts, and so on for the remaining comparators.

With the thresholds of the comparators set in the manner described above, when the voltage control signal VIN (at node 128 in FIG. 1A) presented to the control circuitry 106 is less than 16 volts, all switches will be off except switch SW5. Therefore, the power supply output voltage PS_OUT (at node 136 in FIG. 1A) will be 16 volts. Likewise, when VIN is greater than 24 volts, switch SW4 will turn on, and thus PS_OUT will be 24 volts. Thus, in accordance with the present invention, the power supply output voltage PS_OUT will be responsive to the voltage control signal VIN presented to the control circuitry 106.

As previously described, it is assumed that the multiple output power supply 102 is configured such that more than one output can be selected (i.e., active) during any given time. Alternatively, if this is not the case, the control circuitry 106 maybe operatively configured such that only one of the plurality of control signals Vctl1, Vctl2, ..., Vctln is active for a particular input voltage VIN. This may be accomplished, for example, by employing window comparators in the control circuitry 106, each window comparator having a predetermined threshold range associated therewith. The threshold ranges of the window comparators can be set to be non-overlapping, such that no two comparators generate active control signals simultaneously. Other suitable arrangements for implementing the control circuitry 106 will become apparent to those skilled in the art.

With reference again to FIG. 1A, the present invention contemplates that the multiple output power supply 102, multiplexing circuit 112, and control circuitry 106 may be combined into a controllable voltage source (not shown), such as, for example, a current-controlled voltage source (CCVS) or a voltage-controlled voltage source (VCVS). The controllable voltage source may have a single output and at least one input, whereby a signal generated at the output of the controllable voltage source will be a function of the voltage control signal VIN applied to the input of the controllable voltage source. As the number of discrete voltage and/or current outputs provided by the multiple output power supply 102 increases (i.e., as the output voltage resolution increases), the programmable power supply 100 is able to generate an output voltage that more closely tracks the envelope of the input signal Vhf. Accordingly, the present invention contemplates that the output voltage supplied by the variable output power supply maybe continuously variable, rather than being limited to a predetermined number of discrete voltage output levels.

The voltage control signal VIN presented to the control circuitry 106 is preferably generated by the envelope detector 104. The envelope detector 104 preferably includes an input 122, for receiving an input signal Vhf having an amplitude or envelope associated therewith, and an output 144 for conveying the voltage control signal VIN generated by the envelope detector 104. The voltage control signal VIN generated by the envelope detector 104 is preferably a function of the amplitude of the input signal Vhf. The output 144 of the envelope detector 104 is coupled to the control circuitry 106 at node 128. The input signal Vhf may be represented as a voltage source 120. The envelope detector 104 preferably receives at least a portion of the input signal Vhf through, for example, a capacitive or inductive (e.g., transformer) coupling arrangement 146, which may help minimize potential undesirable effects of direct current (dc) loading on the input signal. The coupling arrangement 146 may be implemented as a microstrip conductor of a predetermined configuration, as will be understood by those skilled in the art. The present invention, however, contemplates that various alternative coupling arrangements may be similarly employed (e.g., direct coupling, etc.).

There are various ways to measure the envelope or amplitude of a signal which are suitable for use with the present invention, some of which are described in the text by Kenneth K. Clarke and Donald T. Hess, *Communication Circuits: Analysis and Design*, Addison-Wesley, 1971, which is incorporated herein by reference. In a basic configuration, the envelope detector 104 may comprise a conventional half-wave rectifier. In an alternative configuration, the envelope detector 104 may comprise a sample-and-hold circuit which periodically samples a peak value of each positive (or negative) signal cycle and holds the sampled peak value until the next signal cycle occurs. Preferably, the envelope detector 104 comprises a digital signal processor (DSP) operatively configured to sample the input signal Vhf at predetermined sample intervals and generate the voltage control signal VIN having a magnitude that is representative of the envelope of the input signal Vhf. It is to be appreciated that the DSP may reside externally with respect to the variable output power supply, 100 such as, for example, on the RF amplifier circuit board.

The variable output power supply 100 preferably includes an analog follower (AF) 110 having a gain that is substantially equal to one (i.e., unity gain), although it is contemplated that the analog follower may be configured to have any predetermined gain. The analog follower 110 essentially functions as a buffer between the switched voltage supply (e.g., comprised of the multiple output power supply 102, multiplexing circuit 112, and control circuitry 106 ) and the RF amplifier 118, primarily to reject spurious voltages that may be generated by the switching process. In this manner, the analog follower 110 presents the RF amplifier with a substantially clean replica of the envelope of the input signal Vhf as a supply voltage.

An input of the analog follower 110 is preferably coupled to the voltage control signal VIN at node 128 through a series delay line 108. The delay line 108 has a predetermined delay $\tau$ associated therewith and functions, at least in part, to compensate for any inherent system delays which may be present, thus enabling the analog follower 110 to more precisely track the voltage control signal VIN. The positive voltage supply VCC for the AF 110 is preferably generated by passing the power supply output voltage PS_OUT appearing at node 136 through a series-connected filter 114, which may be, for example, a low pass filter, or alternative filtering circuitry. The low pass filter 114 functions, at least in part, to remove any undesirable high-frequency components that may be present in the power supply output voltage PS_OUT signal. An output 124 of the analog follower 110 is preferably passed through a series-connected low pass filter (LPF) 116 to generate a power supply output VOUT of the variable output power supply 100. It is this output voltage VOUT which supplies the positive or negative voltage supply rail of the RF amplifier 118.

As previously described, the envelope detector 104 generates a voltage control output signal VIN which is representative of the amplitude of the input signal Vhf at a particular time. The information conveyed by this signal is ultimately used by the variable output power supply 100 to provide a dynamically variable output power supply voltage VOUT which may be utilized by an RF amplifier 118 for affording a predetermined amount of headroom to enable the RF amplifier to amplify the input signal Vhf without clipping.

Consider again the exemplary case depicted in FIG. 1B(e.g.,n=5). When VIN is less than 16 volts, all switches will be off except switch SW5. Consequently, the voltage supply VCC to the analog follower 110 will be 16 volts. The output VOUT of the variable output power supply 100 will be substantially the same magnitude as VIN. Assuming the analog follower is able to generate an output signal that is substantially equal to the positive and negative voltage supply rails, namely, VCC and ground (GND), the analog follower will be able to provide an output voltage from about zero to about 16 volts. When VIN increases to more than 16 volts, for example 20 volts, switch SW4 will turn on, thus providing 24 volts to the VCC supply of the analog follower. Correspondingly, for any given voltage control signal VIN, the voltage supply presented to the analog follower 110 will be greater than VIN.

For high peak-to-average signals, such as, for example, Code Division Multiple Access (CDMA)-type signals, the envelope of the input signal will spend only a relatively small percentage of time in the higher voltage modes of operation (e.g., VOUT>16 volts). As a result, the RF amplifier will primarily use a minimum voltage supply selection (e.g., VOUT=16 volts), thus significantly conserving overall power consumption in the amplification system.

Figure 2:
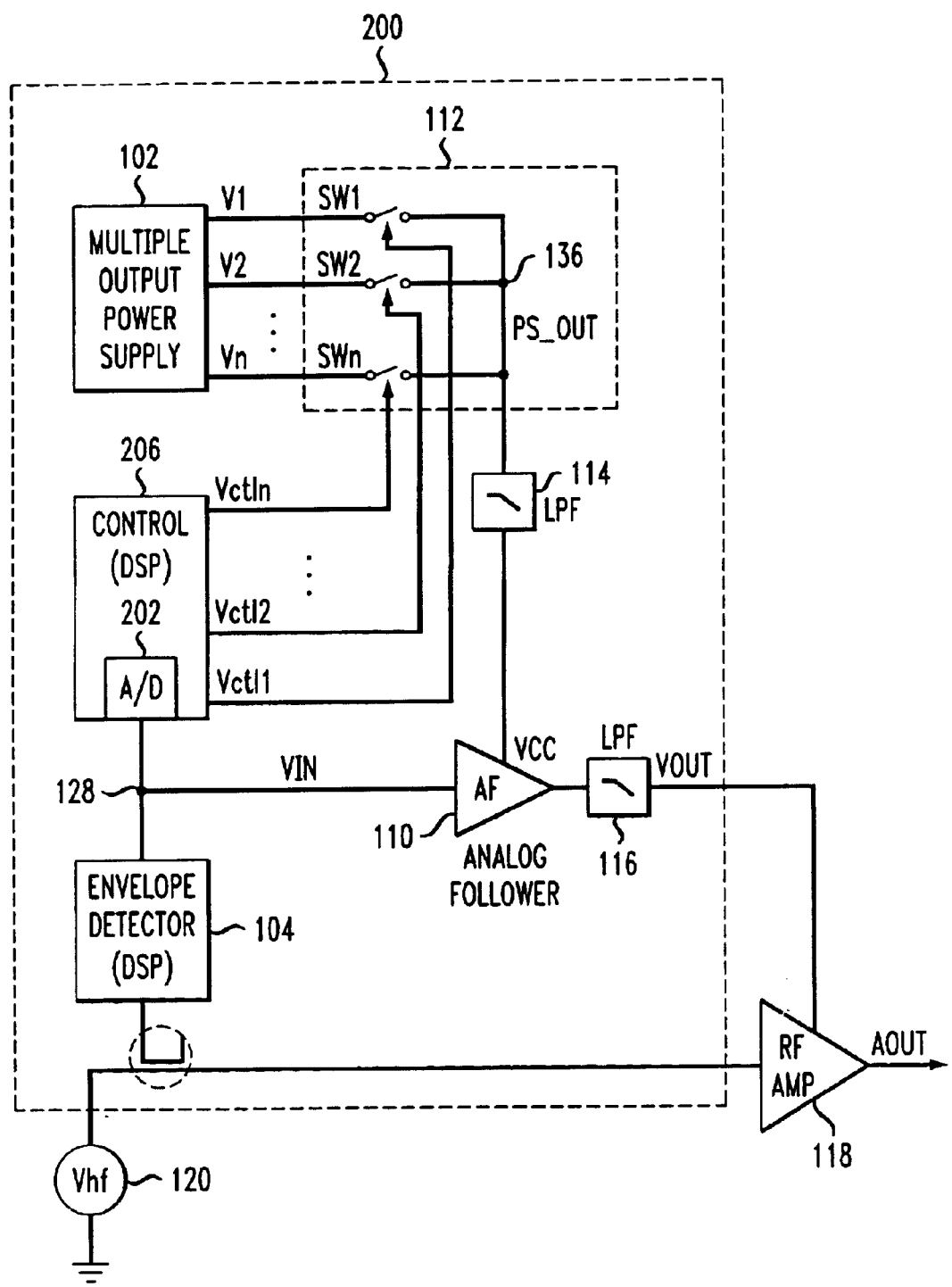
FIG. 2 is a block diagram depicting an exemplary variable output power supply including digital signal processor control, in accordance with another aspect of the present invention.

FIG. 2 illustrates an alternative variable output power supply 200 coupled to the RF amplifier 118 to form an efficient linear amplification system, in accordance with another aspect of the present invention. In comparison to the variable output power supply 100 shown in FIG. 1A, the alternative variable output power supply 200 primarily includes several of the same functional sub-circuits, namely, a multiple output power supply 102, multiplexing circuit 112, envelope detector 104, analog follower 110, and low pass filters 114 and 116. These functional sub-circuits may be implemented and arranged in a manner consistent with the variable output power supply 100 previously described.

As apparent from the figure, the plurality of comparators associated with the control circuitry 106 in FIG. 1A has been replaced by alternative control circuitry 206 for generating the plurality of control signals Vct11, Vct12, . . . , Vct1n operatively coupled to the multiplexing circuit 112. As previously described, the control signals Vct11, Vct12, . . . , Vct1n selectively control which output(s) of the multiple output power supply 102 are to be connected to output node 136 to generate the voltage PS_OUT. Preferably, the control circuitry 206 is implemented as a DSP which is operatively configured to generate the appropriate control signals Vct11, Vct12, . . . , Vct1n in response to the voltage control signal VIN presented to an input of the control circuitry 206 at node 128.

The control circuitry 206 may include an analog-to-digital (A/D) converter 202 for converting the analog input signal VIN into a digital code word which is representative of the amplitude of VIN. Additional circuitry (not shown), such as, for example, a sample-and-hold circuit, may be employed in conjunction with the A/D converter to assist in the conversion process. The DSP associated with the control circuitry 206 may be the same as the DSP associated with the envelope detector 104, such that a single DSP is employed to implement the functions of both sub-circuits. In this manner, the DSP can be configured to not only be detect the envelope of the input signal Vhf presented to the DSP, but the DSP can also be configured to generate the n control signals Vct11, Vct12, . . . , Vct1n for controlling the n corresponding switches in response to the envelope of the input signal. Alternatively, the DSP may reside externally to the variable output power supply 200, such as, for example, on the RF amplifier board.

By employing a look-ahead technique, the DSP used to implement the various functions in the variable output power supply 200 (e.g., envelope detector 104 and control circuitry 206) may also be configured to operatively predict the supply voltage VOUT required by the RF amplifier 118. Various conventional look-ahead algorithms suitable for use with the present invention will be apparent to those skilled in the art. By using such prediction technique, the delay line 108 included in the variable output power supply 100 depicted in FIG. 1A may be advantageously eliminated, thereby allowing the input of the analog follower 110 to be coupled directly to the output of the envelope detector 104 at node 128.

Figure 3:
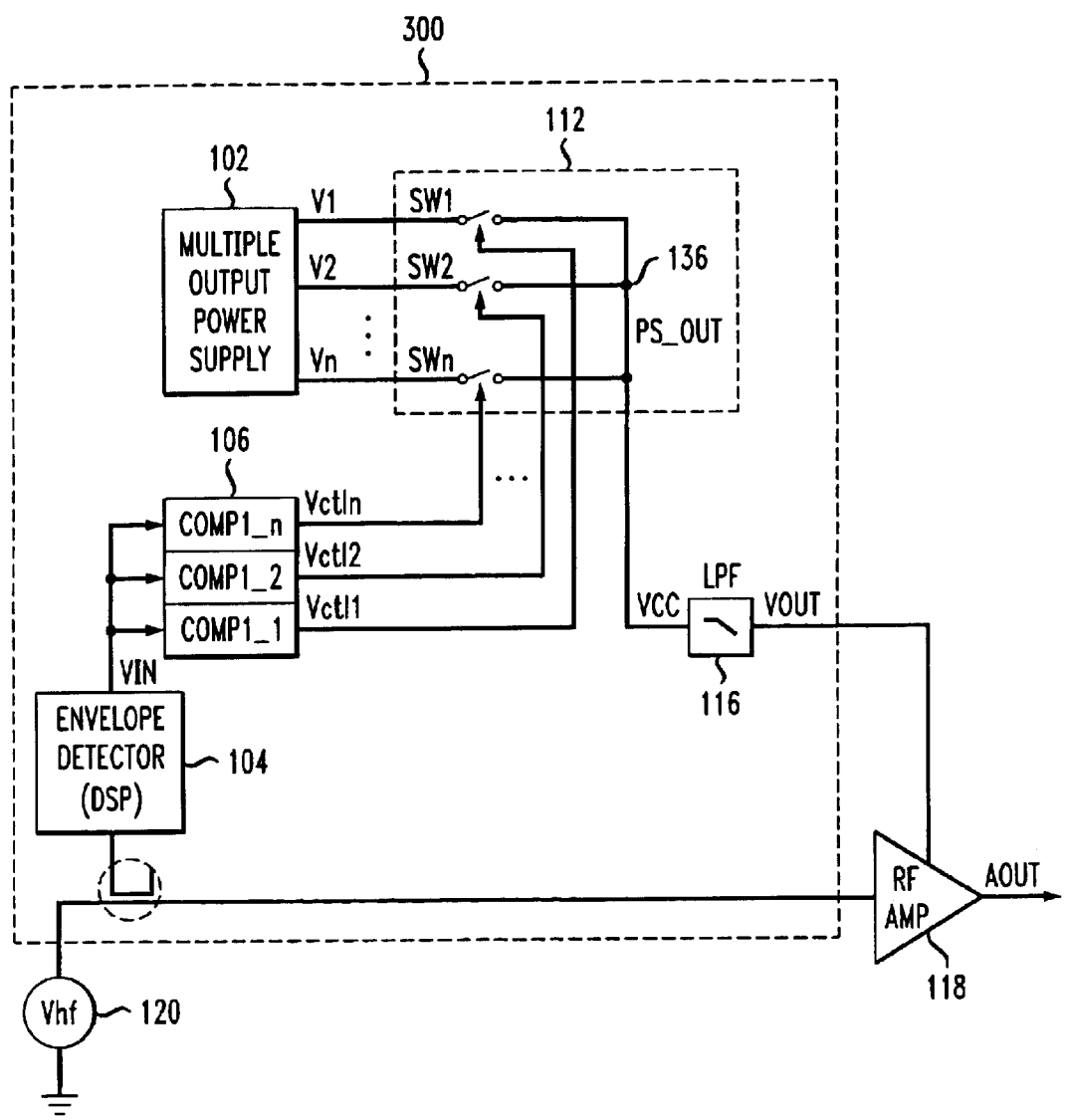
FIG. 3 is a block diagram depicting the exemplary variable output power supply shown in FIG. 1A without an analog follower, in accordance with the present invention.

FIG. 3 illustrates a variable output power supply 300 coupled to the RF amplifier 118 to form an efficient linear amplification system, in accordance with the present invention. The variable output power supply 300 is preferably comprised of function sub-circuits, including a multiple output power supply 102, a multiplexing circuit 112, control circuitry 106, and an envelope detector 104. These functional sub-circuits may be implemented and arranged in a manner consistent with the variable output power supply 100 previously described in connection with FIG. 1A.

Figure 4:
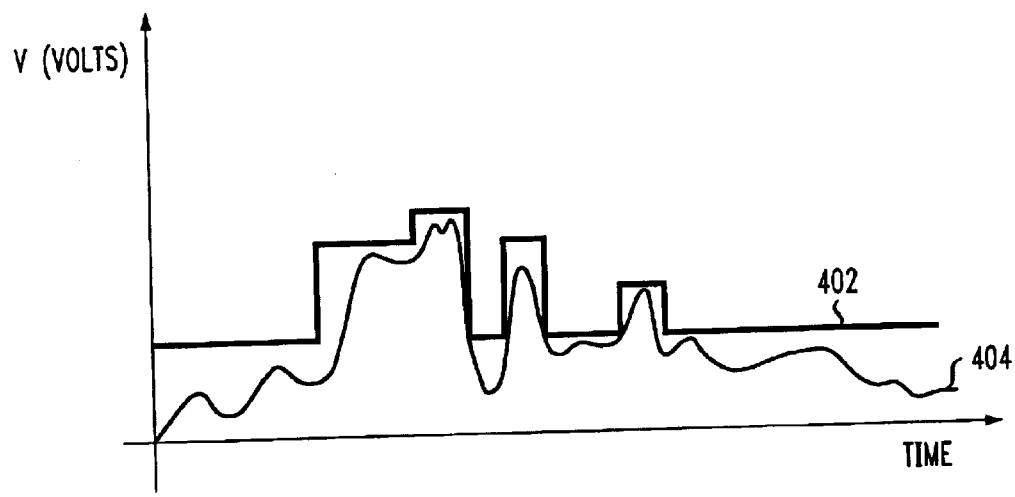
FIG. 4 is a graphical representation illustrating a voltage control signal and an output supply voltage, in accordance with the present invention.

In comparison to the variable output power supply 100 of FIG. 1A, the variable output power supply 300 shown in FIG. 3 is simplified in that the analog follower 110, the delay line 108, and one of the low pass filters 114 have been eliminated. This may be achieved by configuring the RF amplifier 118 to utilize only a few discrete values of supply voltages. In this particular scenario, the output voltage VOUT of the variable output power supply 300 will not substantially follow the signal VIN representing the envelope of the input signal Vhf 120. Rather, as depicted in FIG. 4, the voltage VOUT will be a digitized signal 402 representing the envelope signal VIN 404. As the number of discrete voltage levels provided by the variable output power supply 300 increases, the digitized output signal VOUT will more closely approximate the envelope signal VIN. Since the analog follower may occupy a considerable amount of area on an integrated circuit device, as well as consume significant power, eliminating the analog follower significantly increases the efficiency of the variable output power supply 300, but places an additional burden of rejecting potentially substantial power supply variations on the design of the RF amplifier.

By utilizing the variable output power supply of the present invention for the RF amplifier, an overall linearity of the amplification system may suffer. This may be at least partially attributed to a corresponding variation in the DC or quiescent bias point of the RF amplifier. In systems or applications where the linearity requirement is not very stringent, the degradation in linearity will not present a problem. However, in systems where linearity is more critical, this problem may be at least partially alleviated by modulating the quiescent bias point of the RF amplifier (e.g., gate or base dc bias) simultaneously with the variation in the supply voltage, in accordance with the present invention.

To achieve even greater linearity, the RF amplifier is preferably utilized in conjunction with a linearization arrangement, in accordance with the present invention.

Figure 5:
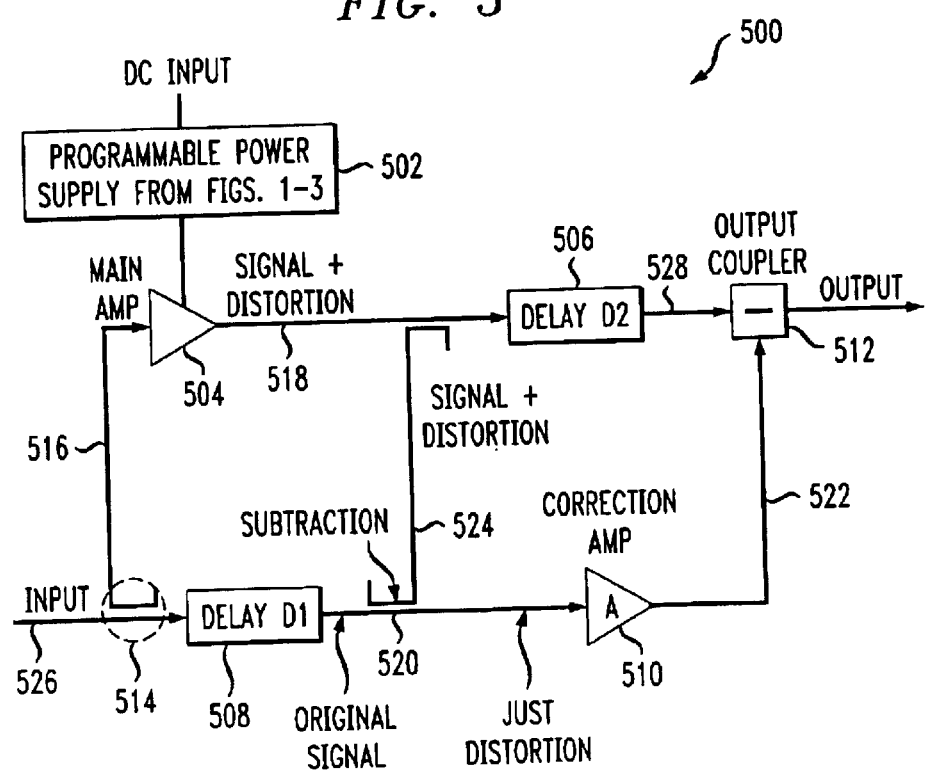
FIG. 5 is a block diagram illustrating the exemplary variable output power supply of FIGS. 1–3 in a power amplification system including a feedforward linearization technique, in accordance with the present invention.
Figure 6A:
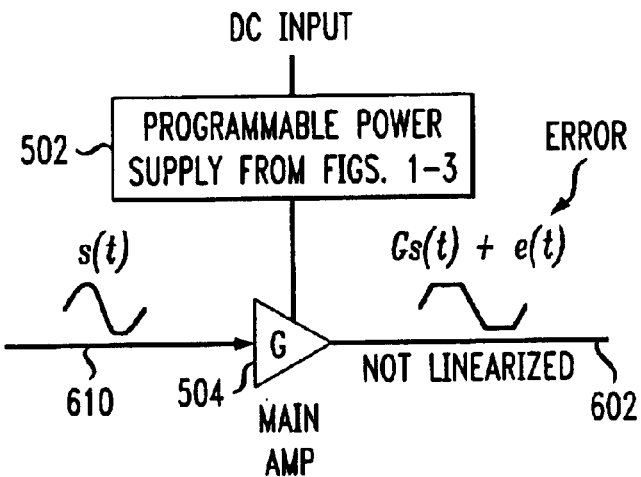
FIG. 6A is a block diagram illustrating the exemplary variable output power supply of FIGS. 1–3 in a power amplification system which generates a nonlinear output signal.
Figure 6B:
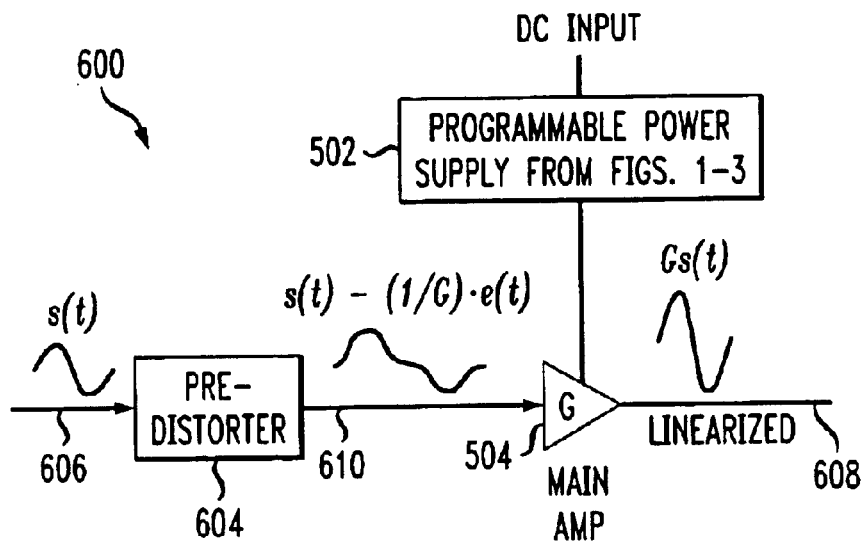
FIG. 6B is a block diagram illustrating the exemplary variable output power supply of FIGS. 1–3 in a power amplification system including a predistortion linearization technique, in accordance with the present invention.

Various linearization techniques are contemplated by the present invention. For example, FIG. 5 depicts an illustrative feedforward linearization technique and FIGS. 6A and 6B depict an illustrative predistortion linearization technique. Both of these linearization techniques will be described in further detail below.

With reference to FIG. 5 there is shown an illustrative feedforward linearization system 500 for generating a substantially linear output signal OUTPUT, in accordance with one aspect of the present invention. The feedforward linearization system 500 includes a variable output power supply 502 supplying power to a main amplifier 504. The variable output power supply 502 maybe formed in a manner consistent with any of the variable output power supplies 100, 200, 300 previously described in connection with FIGS. 1A, 2, and 3, respectively. The main amplifier 504 maybe, for example, an RF amplifier similar to the RF amplifier 118 described above. An input 516 of the main amplifier 504 preferably receives an input signal INPUT via an input coupling arrangement 514. The input coupling 514 may be consistent with the coupling arrangement 146 described above. An output 518 of the main amplifier 504 may generate a signal which includes a linear component, representing a scaled version of the original input signal INPUT, and a distortion component which primarily contributes to the nonlinearity of the output signal 518.

The linearization system 500 includes a feedforward path comprising a delay circuit 508 having a predetermined delay D1 associated therewith coupled to a correction amplifier 510. The delay circuit 508 preferably receives the input signal INPUT at an input 526 of the delay circuit and generates a time-delayed version of the original input signal at an output 520 of the delay circuit. The amount of delay D1 associated with the delay circuit 508 may be selected such that the delayed input signal substantially tracks the linear signal component in the output signal generated by the main amplifier 504. The output 520 of the delay circuit 508 is preferably coupled to the output 518 of the main amplifier 504 via a coupling arrangement 524, which may comprise, for example, a microstrip conductor of a predetermined length, as will be understood by those skilled in the art. Alternative coupling arrangements are similarly contemplated by the present invention. Coupling arrangement 524 presents a signal to the output 520 of the delay circuit 508 which, as previously described, includes a linear signal component and a nonlinear distortion component. The coupling arrangement 524 may be configured such that a subtraction node is formed at the output 520 of the delay circuit 508, whereby the linear signal components are substantially cancelled and a resulting signal is presented to the input of the correction amplifier 510 that preferably comprises a pure distortion component.

The correction amplifier 510 preferably has a predetermined gain A associated therewith. Thus, an output signal 522 generated by the correction amplifier 510 will comprise a scaled version of the distortion signal presented to the input of the correction amplifier (e.g., multiplied by the gain A of the correction amplifier). The gain A of the correction amplifier 510 may be set to any desired value, and is preferably selected such that a magnitude of the output signal 522 substantially matches a magnitude of the distortion component in the output signal 518 generated by the main amplifier 504.

The output signal 518 generated by the main amplifier 504 is preferably fed to a series-connected delay circuit 506 having a predetermined delay D2 associated therewith. Delay circuit 506 functions, at least in part, to selectively time-align the nonlinear output signal 518 generated by the main amplifier 504 with the scaled distortion signal 522 are preferably fed to a subtraction node 512, whereby the distortion component of the signal 528 substantially cancels the scaled distortion signal 522, leaving only an amplified version of the original linear input signal INPUT. Therefore, in accordance with the techniques of the present invention, the resulting signal OUTPUT is substantially linear.

FIGS. 6A and 6B illustrate an alternative linearization technique which utilizes predistortion, in accordance with another aspect of the present invention. As shown in FIG. 6A, a signal s(t) is presented to an input 610 of the main amplifier 504 having a predetermined gain G associated therewith. The variable output power supply 502 of the present invention is coupled to the main amplifier 504 and supplies a voltage to the main amplifier which is dynamically variable in response to an envelope of the input signal s(t), as previously described.

The main amplifier 504 may generate an output signal 602 which primarily comprises a linear component which is a scaled version Gs(t) of the original input signal s(t), and an error component e(t) which may be nonlinear. In order to linearize the output of the main amplifier, a predistortion system 600 may be utilized, as shown in FIG. 6B. As apparent from the figure, a predistorter 604 is employed including an input 606 for receiving the input signal s(t) presented to the predistorter, and an output which is coupled to the input 610 of the main amplifier 504. As will be explained below, the predistorter 604 maybe configured to generate a predistortion signal which, when passed through the main amplifier 504, substantially removes the nonlinear component in the output signal. The predistorter 604 may comprise, for example, a DSP operative to perform the linearization techniques of the present invention.

The predistorter 604 is operatively configured so as to have a transfer function that substantially cancels the error component e(t) generated by the main amplifier 504. Accordingly, the output signal generated by the predistorter 604 preferably comprises an original signal component s(t) and an error component $$-\frac{1}{G} \cdot e(t).$$

It is to be appreciated that since the error component in the predistortion signal will be multiplied by the gain G of the main amplifier 504, the error component generated by the predistorter 604 must be matched to the negative inverse of the gain of the main amplifier (e.g.,−1/G) in order to substantially cancel the error component e(t) present in the output signal of the main amplifier. Thus, using the predistortion system 600 of the present invention described herein, the output signal 608 of the main amplifier 504 will ideally comprise only a linear component representing a scaled version of the original input signal.

It is to be appreciated that, although the present invention has been described primarily in terms of a variable voltage power supply, the techniques of the invention are similarly applicable to a variable current supply. In this regard, it is contemplated that conventional conversion circuitry may be utilized in conjunction with the present invention for operatively transforming a voltage into a representative current, or vice versa, for obtaining an output of a desired form.

Although illustrative embodiments of the present invention have been described herein with reference to the accompanying drawings, it is to be understood that the invention we claim:

1. A variable output power supply, comprising:
an envelope detector for receiving an input signal and for generating a control signal representative of an envelope associated with the input signal; and
a controllable source for generating an output that dynamically varies in response to at least the control signal and functionally corresponds with the envelope of the input signal;
wherein the controllable source comprises:
a multiple output power supply having a plurality of outputs, the multiple output power supply generating at least one of: (i) a plurality of substantially constant output voltages, and (ii) a plurality of substantially constant output currents corresponding to the plurality of outputs;
a multiplexing circuit responsive to at least one output selection signal for selecting at least one of the plurality of outputs; and
control circuitry having an input for receiving the control signal, the control circuitry generating the at least one output selection signal.

2. The variable output power supply of claim 1, wherein the multiplexing circuit comprises:
a plurality of selectable switches, each of the switches coupled with a corresponding output of the multiple output power supply, a second terminal of each of the switches being coupled together to form an output of the controllable source, each of the plurality of switches having a control terminal for receiving the at least one output selection signal and selectively connecting a corresponding output of the multiple output power supply to the output of the controllable source in response thereto.

3. The variable output power supply of claim 1, wherein the control circuitry comprises:
a plurality of comparators each for receiving at least a portion of the control signal generated by the envelope detector and a respective reference source, the comparators generating the at least one output selection signal for selectively controlling a corresponding output associated with the multiple output power supply, the at least one output selection signal representative of a difference between the control signal and the reference source corresponding to a first comparator.

4. The variable output power supply of claim 3, wherein the reference source corresponding to at least a given one of the plurality of comparators is selected to be in a range substantially between an output generated by a corresponding output of the multiple output power supply and a next lowest output of the multiple output power supply.

5. The variable output power supply of claim 1, wherein the control circuitry comprises:
an analog-to-digital (A/D) converter for receiving the control signal and for generating a digital code representative of the envelope of the input signal; and
a digital signal processor (DSP) for generating the at least one output selection signal for control the multiplexing circuit.

6. The variable output power supply of claim 1, wherein a digital signal processor (DSP) implements at least one of a portion of the envelope detector and the controllable source.

7. A variable output power supply, comprising:
an envelope detector for receiving an input signal and for generating a control signal representative of an envelope associated with the input signal;
a controllable source for generating an output that dynamically varies in response to at least the control signal and functionally corresponds with the envelope of the input signal; and
an analog follower coupled with the envelope detector and with the variable output power supply, the analog follower generating a supply output signal having a magnitude that is substantially equal to the envelope of the input signal.

8. The variable output power supply of claim 7, further comprising:
at least one filter for substantially removing selected frequency components from the supply output signal.

9. The variable output power supply of claim 7, further comprising:
a delay circuit having a delay selected to enable the supply output signal to substantially track the envelope of the input signal.

10. A variable output power supply, comprising:
an envelope detector for receiving an input signal and for generating a control signal representative of an envelope associated with the input signal; and
a controllable source for generating an output that dynamically varies in response to at least the control signal and functionally corresponds with the envelope of the input signal;
wherein the envelope detector comprises:
a digital signal processor (DSP) configurable for sampling a peak value of the input signal at periodic intervals and for generating the control signal in response thereto, the control signal being a function of the envelope of the input signal received by the envelope detector.

11. An amplification system, comprising:
a variable output power supply, the variable output power supply having:
an envelope detector having an input for receiving an input signal presented thereto, the envelope detector generating a control signal that is representative of an envelope associated with the input signal; and
a controllable source operatively coupled to the envelope detector, the controllable
source generating an output that dynamically varies in response to at least the control signal, whereby the output of the controllable source is a function of the envelope of the input signal;
an amplifier having a predetermined gain associated therewith, the amplifier having at least one supply input operatively coupled to the variable output power supply for receiving the output from the variable output power supply, an input for receiving the input signal, and an output for generating an output signal; and
linearization circuitry operatively coupled to the amplifier, the linearization circuitry being configured to substantially remove a nonlinear component in the output signal generated by the amplifier.

12. The amplification system of claim 11, wherein the linearization circuitry comprises:
a feedforward path operatively coupled to the input signal, the feedforward path being configured to generate a feedforward signal that is substantially matched to a magnitude of the nonlinear component in the output signal generated by the amplifier, and a summing junction having a first input for receiving the output signal, and a second input for receiving the feedforward signal, the summing junction being configured to subtract the feedforward signal from the output signal, whereby the feedforward signal substantially cancels the nonlinear component in the output signal.

13. The amplification system of claim 11, wherein the linearization circuitry comprises:

a predistorter having an input for receiving the input signal and an output operatively coupled to the input of the amplifier, the predistorter being configured to generate a predistortion signal having an original signal component and a nonlinear component, the nonlinear component in the predistortion signal substantially matching an inverse of the nonlinear component in the output signal generated by the amplifier, whereby when the predistortion signal is passed through the amplifier, the nonlinear component in the output signal is substantially removed.

14. In a linear amplification system having an amplifier, a method of providing a variable output power supply, the method comprising the steps of:

detecting an envelope of an input signal to be amplified;

generating a control signal, the control signal being a function of the envelope of the input signal;

providing a controllable source, the controllable source having a plurality of outputs and being configured to generate at least one of: (i) a plurality of output voltages, and (ii) a plurality of output currents corresponding to the outputs of the controllable source;

selecting at least one of the outputs generated by the controllable source in response to the control signal to generate an output supply signal of the variable output power supply, whereby the output supply signal is a function of the envelope of the input signal; and substantially removing at least a portion of a nonlinear component associated with an output signal generated by the amplifier.

15. The method of claim 14, wherein the step of removing at least a portion of a nonlinear component associated with the output signal comprises the step of:

configuring the amplification system in a feedforward arrangement, the feedforward arrangement having:

a feedforward path operatively coupled to the input signal, the feedforward path being configured to generate a feedforward signal that is substantially matched to a magnitude of the nonlinear component in the output signal generated by the amplifier; and a summing junction having a first input for receiving the output signal, and a second input for receiving the feedforward signal, the summing junction being configured to subtract the feedforward signal from the output signal, whereby the feedforward signal substantially cancels the nonlinear component in the output signal.

16. The method of claim 14, wherein the step of removing at least a portion of a nonlinear component associated with the output signal comprises the step of:

predistorting the input signal to generate a predistortion signal, the predistortion signal having an original signal component and a nonlinear component, the nonlinear component in the predistortion signal substantially matching an inverse of the nonlinear component associated with the output signal generated by the amplifier, whereby when the predistortion signal is passed through the amplifier, the nonlinear component in the output signal is substantially removed.

* * * * *